United States Patent [19]

Wessling et al.

[11] Patent Number: 5,567,355
[45] Date of Patent: Oct. 22, 1996

[54] INTRINSICALLY CONDUCTIVE POLYMER IN THE FORM OF A DISPERSIBLE SOLID, ITS MANUFACTURE AND ITS USE

[75] Inventors: Bernhard Wessling; Harald Volk, both of Bargteheide; Susanne Blattner, Hamburg, all of Germany

[73] Assignee: Zipperling Kessler & Co. (GmbH & Co.), Ahrensburg, Germany

[21] Appl. No.: 59,740

[22] Filed: May 12, 1993

Related U.S. Application Data

[63] Continuation of Ser. No. 350,738, filed as PCT/EP88/00798, Sep. 2, 1988, published as WO89/02155, Mar. 9, 1989, abandoned.

[30] Foreign Application Priority Data

Sep. 4, 1987 [DE] Germany .................. 37 29 566.7

[51] Int. Cl.$^6$ .................. H01B 1/00; H01B 1/12
[52] U.S. Cl. .................. 252/500; 524/439; 524/401; 528/502 C; 528/503; 428/402
[58] Field of Search .................. 252/500, 512, 252/518; 524/439, 401; 528/502, 503

[56] References Cited

U.S. PATENT DOCUMENTS

| | | | |
|---|---|---|---|
| 4,566,955 | 1/1986 | Narmann | 252/500 |
| 4,567,250 | 1/1986 | Naarmann et al. | 252/500 |
| 4,935,164 | 6/1990 | Wessling et al. | 252/500 |
| 5,079,096 | 1/1992 | Miyake et al. | 252/500 |
| 5,281,363 | 1/1994 | Shacklette et al. | 252/500 |

FOREIGN PATENT DOCUMENTS

| | | |
|---|---|---|
| 0123827 | 11/1984 | European Pat. Off. . |
| 0131914 | 1/1985 | European Pat. Off. . |
| 0132709 | 2/1985 | European Pat. Off. . |
| 3422316 | 6/1984 | Germany . |

OTHER PUBLICATIONS

WO, A, 87/01504 (Battelle) Mar. 12, 1987.
Wessling, "Elektrisch leitf hige Kunststoffe", Carl Hanser Verlag, Munich 1986, Kunststoffe 76 (1986) pp. 930–936; (partial translation of relevant passages).

*Primary Examiner*—Paul Lieberman
*Assistant Examiner*—M. Kopec
*Attorney, Agent, or Firm*—Cushman Darby & Cushman

[57] ABSTRACT

An intrinsically conductive polymer is in the form of a dispersible solid of primary particles with a specific surface area according to BET of >15 m$^2$/g and with an average diameter of less than 500 nm, in which preferably not more than 20% of aggregates with an average size >1 μm are present in the particle size range > 500 nm. For the manufacture of the polymer the polymerization is carried out in a solvent in which the appropriate monomer is soluble or colloidally dispersible, but in which the polymer that is formed is insoluble, whereby the temperature of the reaction mixture is not allowed to rise more than 5° C. above the starting temperature.

19 Claims, 5 Drawing Sheets

INTRINSICALLY CONDUCTIVE POLYMER IN THE FORM OF A DISPERSIBLE SOLID, ITS MANUFACTURE AND ITS USE

This is a continuation of application Ser. No. 07/350,738, filed as PCT/EP88/00798 on Sep. 2, 1988, published as WO89/02155 on Mar. 9, 1989, which was abandoned upon the filing hereof.

DEFINITIONS—EXPLANATION OF TERMS

Some terms have been used in the following which are not yet in general usage by the average person skilled in the art. Some definitions and explanations of terms are therefore given in introduction.

a) "(Intrinsically) conductive polymers" (ICP)

This term refers to organic polymers which have (poly-)conjugated π-electron systems (e.g. double bonds, aromatic or heteroaromatic rings or triple bonds). Examples of such polymers are polydiacetylene, polyacetylene (PAc), polypyrrole (PPy), polyaniline (PAni), polythiophene (PTh), polyisothianaphthene (PITN), polyheteroarylenvinylene (PArV), in which the heteroarylene group can be e.g. thiophene, furan or pyrrole, poly-p-phenylene (PpP), polyphenylene-sulphide (PPS), polyperinaphthalene (PPN), polyphthalocyanine (PPhc) etc., and their derivatives (formed for example from monomers substituted with side chains or groups), their copolymers and their physical compounds. They can exist in various states, each described by different empirical formulae, which can generally be converted essentially reversibly into one another by (electro-)chemical reactions such as oxidation, reduction, acid/alkali reaction or complexing. These reactions are also occasionally known as "doping" or "compensation" in the literature, or can be regarded as "charging" and "discharging" in analogy with the electrochemical processes in batteries. At least one of the possible states is a very good conductor of electricity, e.g. has a conductivity of more than 1 S/cm (in pure form), so one can speak of intrinsically conductive polymers. These forms of the ICP are generally regarded as polyradical cationic or anionic salts.

A good overall view of the (intrinsically) conductive polymers synthesised to date with a chemical structure suitable for the present objective, is to be found in Synthetic Metals, Issues 17, 18 and 19 (1987), and in Synthetic Metals (in press), Proceedings of the ICSM '88 (Santa Fe).

b) "Percolation"

This is generally understood to mean the sudden change of a property of a system at a certain critical point during the linear change of another property. Here this term refers to the sudden increase in the electrical conductivity of a 2-phase system at a certain critical concentration ("percolation point" or "percolation threshold") of the conductive phase in the continuous, insulating matrix.

c) "Post-polymerisation processing of ICP"

This refers to the shaping treatment (original forming) or all the pre-treatment stages necessary for forming that are carried out on raw, already polymerised, possibly cleaned and dried, if necessary, un-formed (e.g. in powder form) ICPs, to produce a usable semi-finished product, almost finished product, or end/finished product.

d) "Polymer blend"

This is generally understood to mean macroscopically homogeneous mixtures of partly compatible or incompatible organic polymers. They always consist of two or more phases. In contrast to this a polymer alloy is a single-phase mixture of compatible polymers; a composite is a composition, usually already a semi-finished or (almost) finished product, which constitutes a mixture of polymers with other polymers or other non-polymer substances which is macroscopically not homogeneous, but often a layered arrangement of the individual components; a compound is a macroscopically homogeneous compound of one or more polymers with one or more non-polymer and not necessarily organic substance(s).

e) "Primary particle"

The smallest morphological unit, i.e. super-molecular structural unit, (here: of an ICP) that is recognisable in the scanning or transmission electron microscope.

f) Secondary structure, tertiary structure: "aggregate", "agglomerate"

The primary particles assemble to form higher structures (secondary and tertiary structures). By "aggregate" one understands the assemblage of primary particles brought about by growing together and stabilised by material bridges; by "agglomerate" one understands the assemblage of primary particles which only consists of point-like contacts. Agglomerates can be broken down again in a substrate and dispersed as primary particles, with aggregates this is not possible without breaking chemical bonds. This distinction, conventionally used in pigment technology (cf Herbst/Hunger, "Industrielle organische Pigmente", VCH 1987), is also introduced here for the description of the morphology of ICPs. It should particularly be noted that in the inventor's previous publications these different terms were not (yet) used, instead due to a lack of more detailed knowledge of the structure of these substances he spoke indiscriminately of "agglomerates".

g) Solubility

A polymer is dissolved when its entire polymer chain is surrounded on all sides with molecules of the solvent, by which means the primary particles are usually swollen. There are then no short range interactions between chain segments of different polymer chains. A true polymer solution can no longer be separated from the solvent by a filter, however fine.

STATE OF THE ART

The introduction of intrinsically conductive polymers into the market depends to a great extent on the discovery of suitable methods for post-polymerisation processing of the intrinsically conductive polymers. In three previous publications the possibility was described of processing intrinsically conductive polymers after polymerisation, and a distinction was drawn between two application processes:

1. The processing of pure intrinsically conductive polymers.

In DE-PS 34 21 993 a process was described for the manufacture of formed parts from electrically conductive organic polymers and/or organic conductors together with a device for carrying out the process, in which [process] the conductive polymers are shaped under an inert atmosphere above 40° C. and below the decomposition temperature of the conductive polymers and/or organic conductors at a pressure of at least 500 bar. This process gave good results and particularly a characteristic change in the morphology of the conductive polymers, cf. in this the publications: B. Welling and H. Volk, Synthetic Metals 15, 183–193 (1986); 16, 127–131 (1986); 18, 671–676 (1987). The homogeneity of the finished parts, however, still required some improvement for certain uses, and the cost of the process and the need to use very high quality pressure-resistant materials demand an optimisation of the process.

The later works by Stamm (Mol.Cryst. Liq. Cryst. 109, 259 (1984)) give no new approaches for this. Here PpP, which was not oxidised or reduced (not "doped"), was squeezed through a nozzle under high pressure but under an oxygen atmosphere, and a fibre was thus produced according to the methods of a solid-phase extrusion (which was then "doped"). The works by Kreja (Angew. Makromol. Chem. 127, 33 (1984)) showed a compressibility of undoped conductive polymer to the extent that, following the treatment with oxidation agents after the pressure treatment, conductivities were to be observed which were dependent on the previously applied pressure.

Both works support the hypothesis presented in DE-PS 34 21 993 and subsequent publications that conductive polymers show a rheology comparable to—in any case highly viscous—polymeric fluids or liquid crystals. The aforementioned works of the other authors do not in any case offer any approaches for the further optimisation of the process.

2. The production of polymer blends

In DE-PS 34 22 316 and in DE-OS 37 29 566.7 the manufacture of polymer blends with intrinsically conductive polymers is described. It is possible using this process to manufacture polymer blends from thermoplastic polymers and conductive polymers in a broad mixture ratio. This process still has some disadvantages which might prevent the wide introduction of polymer blends with intrinsically conductive polymers. There is above all the fact that only thermoplastic polymers are suitable for dispersion and that as a result of the process there is not quite an optimum dispersion, this can be seen particularly in the particle size of the dispersed particles and in the wide distribution of the particle size. The limitation to matrix polymers with a solubility parameter of more than 8.6 $(cal/cm^3)^{1/2}$ might also prove a restriction for many uses.

It has proved to be an additional disadvantage of the previously described process that the sometimes very large particles impair the reproducibility of the percolation behaviour of conductive polymers. The disclosed percolation of polyaniline in PCL (B. WeBling, Kunststoffe 76, 930–936 (1986)) can only be reproduced with difficulty e.g. in various experiments carried out in succession and essentially under the same conditions: the percolation point may also be higher than 7.5% by volume and the saturation point may be above 45%. It is also described here (loc.cit., 935), that around 40% of the particles are in aggregates of 0.5 to 1 um size or more. It has however also not been possible in the prior art to attain a saturation point of conductivity below 45% by volume.

Uses below the percolation point can also be found for the polymer blend disclosed in DE-PS 34 22 316, e.g. for antistatic requirements which call for a certain transparency, or for indicators.

Previously it has not however been possible to manufacture dispersions of intrinsically conductive organic polymers and to use these for non-linear optical effects. One would require monocrystals or oriented thin films/layers of the appropriate pure substances or there have been attempts to use organic materials exhibiting non-linear optical effects in organic solvents or dissolved in polymers.

In the literature numerous proposals have been made for the manufacture of polymer blends or pure intrinsically conductive polymers which are said to be processable as a solution or melt:

a) Polymer blends or composites by polymerisation of the intrinsically conductive polymers in the polymeric non-conductive matrix or in a solution of the matrix polymers (cf. DE-OS 35 44 957; DE-OS 34 09 462; Skotheim, U.S. patent application Ser. No. 448, 115; M. Paoli et al, J. Polym. Sc. 23(6), 1687(1985); EP-OS 160911; EP-OS 191726; G. Street et al, Mol. Cryst. Liq. Cryst. 118, 137 (1985), here p. 145).

All the processes have the disadvantage that they carry a high processing cost and despite this no processable highly conductive blends are produced.

b) Polymer blends or composites by manufacturing processes following the completed polymerisation of a "soluble" intrinsically conductive polymer (cf. K. Wynne et al, Polym. Comm. 26 (6), 162 (1985); EP-OS 144600; DE-OS 33 35 738). The disadvantages are processing using solvents, the need to use high concentrations and the still very low conductivity (e.g. $10^{-9}$ S/cm).

c) Copolymers or soluble and melt-processable homopolymers. The production of processable, and especially soluble, copolymers or derived (changed by e.g. alkyl groups) homopolymers offers an alternative, but because of the cost of the manufacture of the starting materials and the polymerisation process it has no advantages over the manufacturing processes of insoluble intrinsically conductive polymers (cf. W. Porzio et al, Mol. Cryst. Liq. Cryst. 117, 71 (1985); G. Street, loc.cit. p. 142; G. Street et al, J.Chem.Soc., Chem. Comm. 1985, 375.

As examples of the soluble intrinsically conductive polymers, which clearly also have a glass transition point, the soluble polythiophenes and their copolymers are listed ( cf. R. Elsenbaumer et al, Synth. Met. 18, 277 (1987)), the processability per se of which appears simplified in comparison with, e.g. a polypyrrole or polyaniline, these substances however exhibit very high percolation points in polymer blends (e.g. over 10 to 15% by weight) and to date can only be processed as pure substances or in polymer blends via solutions, and not by solvent-free processes, mainly in their non-complexed, neutral, non-conductive form.

It can be regarded as a disadvantage for the processes according to b) and c) that to date it has clearly not been possible to find processing methods for already "doped" (oxidised) ICPs, so that the reaction for the production of the conductive forms of this ICP is only carried out after processing via solution or melt. Particularly under the aspect of the manufacture of two-phase polymer blends, in which with the help of the instructions given in DE-PS 34 22 316 a two-phase percolating system is obtained after dispersion of the conductive polymers, the need is occasionally expressed for the production of particularly fine primary particles. This has however not yet been achieved.

It should be taken into consideration here that very different ideas are associated with the term "fine". This is also linked with the percolation theories that are accepted among experts today. According to these (cf. B. WeBling, Kunststoffe 76,930–936 (1986), Section 4 and the literature cited there) carbon blacks with secondary aggregates as highly structured as possible give low percolation points and high conductivities in combination with polymers. The research on conductive carbon blacks is therefore directed towards more and more complicated carbon black aggregate structures which should not be destroyed when incorporated. Using the same idea Hocker et al (EP-OS 62 211; EP-OS 83 330) synthesised highly structured PAc for uses in polymer blends. The suggestion is also occasionally made that one should synthesise ICPs in fine fibres.

In many other works "fine" is used in connection with particle sizes of a few μm (microns). In DE-OS 3 07 954, for example, the manufacture of fine polypyrrole raw materials is disclosed which are produced using fine carrier particles (a similar solution to the problem is found in S. Jasne, Synth. Met. 15, 175 (1986)). The disadvantage of this procedure however is that in addition to the conductive polymer a foreign substance (carrier) must be used in order to obtain fine particles, this is very expensive and does not permit the manufacture of pure mouldings consisting only of the conductive polymers, the resulting particles are considerably larger than those of the carrier materials, namely around 10 um.

the particles produced in two-phase polymer systems do not give the desired low percolation points or low concentrations of the saturation conductivity.

In DE-OS 33 25 893 the oxidative polymerisation of pyrrole in aqueous media is described with a subsequent electrochemical charging using conductive salts. Before the electrochemical charging average particle diameters occur of 0.2 μm with a specific surface of 15 $m^2/g$. There are no data on the particle size and surface of the final product or on the processability to pure PPy mouldings and the properties of these. It is clearly not the intention to use the products in polymer blends and this is also not possible (see below).

Such polymer blends ("electrically conductive thermoplastic mixtures of macromolecular compounds and fine pyrrole-polymerisates") were clearly the aim of DE-OS 34 09 462, because the "fine" polypyrroles described above cannot, for example, be incorporated into thermoplastic polymers after the completion of the polymerisation and electrochemical charging. For this reason pyrrole was polymerised in solution or suspension in the presence of the dissolved matrix polymers or their monomers, proportions of 40 to 60% by weight of pyrrole being preferred. Conductivities of $10^{-7}$ to $10^{-1}$ S/cm are obtained thereby without more detailed data being given on the concentration/conductivity relationship. The PPy exists in particle sizes of 0.1 to 10 um. There was clearly no process found to produce fine polypyrroles or other intrinsically conductive polymers and then to manufacture polymer blends from them. This is certainly also not possible with the polythiophenes with 5–90 μm particle sizes disclosed in DE-OS 34 17 942.

Our tests with samples of "fine" polypyrrole of this type from various sources have shown that in spite of the small particle size stated in each case only a very high percolation point (more than 25 to 30% by volume), a very low saturation conductivity (never better than $10^{-4}$ S/cm) and a very high saturation point (greater than 50 to 60% by volume) were achieved. These results were confirmed in retrospect by a publication by BASF for the Plastics' Fair K'86 "Aus der Forschung" (imprint KUX 8611d, 10.86), in which on page 39 a diagram is depicted showing the percolation curve of a fine polypyrrole. In this the percolation point stands at 30% by weight, the saturation point at 60% by weight and the saturation conductivity at $10^{-6}$ S/cm. These fine polypyrrole samples therefore cannot be regarded either as sufficiently dispersible or sufficiently dispersed.

Bjorklund and Liedberg, J. Chem. Soc., Chemical Communications 1986, page 1293, describe the polymerisation of polypyrrole in an aqueous solution of methylcellulose. But the finished product gained from it also always contains very considerable proportions of methylcellulose, and can in principle be regarded as a polymer blend of polypyrrole and methyl cellulose. To this extent Table 1 given in the aforementioned publication reproduces the percolation curve of polypyrrole dispersed in methylcellulose. According to this the percolation point of this two phase system is around 60 to 65 parts [polypyrrole] to 30 to 35 parts [methylcellulose monomer units], and the saturation point of the conductivity not before 93 to 94 parts polypyrrole to 6 to 7 parts methylcellulose monomer units.

Our own attempts to achieve a stabilisation of the initially producible fine polypyrrole particles by the addition of polyvinylpyrrolidone and polyvinylalcohol to the reaction solution, resulted in colloidal polypyrrole in aqueous systems. This material has particle sizes which are unusually even and very small. Unfortunately, it emerged that polypyrrole cannot be separated from these dispersions by the usual filtration or centrifuging methods and that even the polypyrrole colloid, which was stabilised by polymers such as polyvinylbutyral or polyvinylpyrrolidone, can only be recovered after the processing of the reaction medium in a form which is then no longer re-processable (i.e. no longer dispersible). Only pressure filtration through an extremely fine filter (0.02 μm) results in the separation of the colloid from the aqueous medium, but in too small a quantity per unit of time. Attempts were also made to convert the aqueous dispersions of this polypyrrole-PVP-system into a dispersible form by freeze-drying, but these did not succeed. The results from S. Armes and B. Vincent (J. Chem. Soc., Chem. Comm. 1987, 288) are not in contradiction to these results. These authors also described the manufacture of very fine polypyrrole in an aqueous medium, the polypyrrole that occurs being kept stable by polyvinylpyrolidone and comparable polymers in the dispersion state. The freeze-drying of these reaction products is admittedly also described, but there is no indication as to whether the dried products thus obtained are processable in any form, e.g. as re-dispersible conductive polymer systems, this not being the case from our own tests. It obviously makes no sense to carry out reactions in reaction media which admittedly yield fine conductive polymers but where the conductive polymers cannot be recovered in a form free from substances that cannot be removed during processing, e.g. foreign polymers such as methyl cellulose or polyvinylpyrrolidone. It does not appear advantageous for the solution of the problem in question to synthesise conductive polymers which contain considerable additives of foreign substances that cannot be removed in the course of the processing.

In summary it can therefore be said:

1. There are no indications in the literature as to how one might produce intrinsically conductive polymers as raw materials such that they are better suited as those described in EP-OS 168 620 and 168 621 for further processing or shaping procedures in pure form or in polymer blends than was previously the case.

2. The suitability of fine ICP raw materials as starting materials for the further processing is not inconceivable, and various tests have been made in this direction which have not however achieved their goal—neither pure fine ICPs, nor those which were in a colloidal dispersed state (with polymeric dispersion aids), nor those which were polymerised on fine carriers, are usable. Fine ICPs therefore do not at first appear suitable for the solution of the problem.

3. For the processing of pure ICPs into mouldings, e.g. in a high pressure process according to DE-PS 34 21 993, no concepts emerge for particularly suitable raw material forms. It seems logical to add raw materials that are already partially aggregated.

4. For the processing of ICPs into polymer blends it seems recommendable according to the prior art to add highly structured, e.g. fibrillar or chain-like, starting forms, in order to obtain percolation at low concentrations.

5. It therefore the appears reasonable to use different qualities of ICP raw materials for different forming processes.

It is therefore the object of the present invention to produce intrinsically conductive polymer raw materials which are particularly well suited for further processing as a pure material or as a dispersed phase in polymer blends.

THE INVENTION

Figure 1:
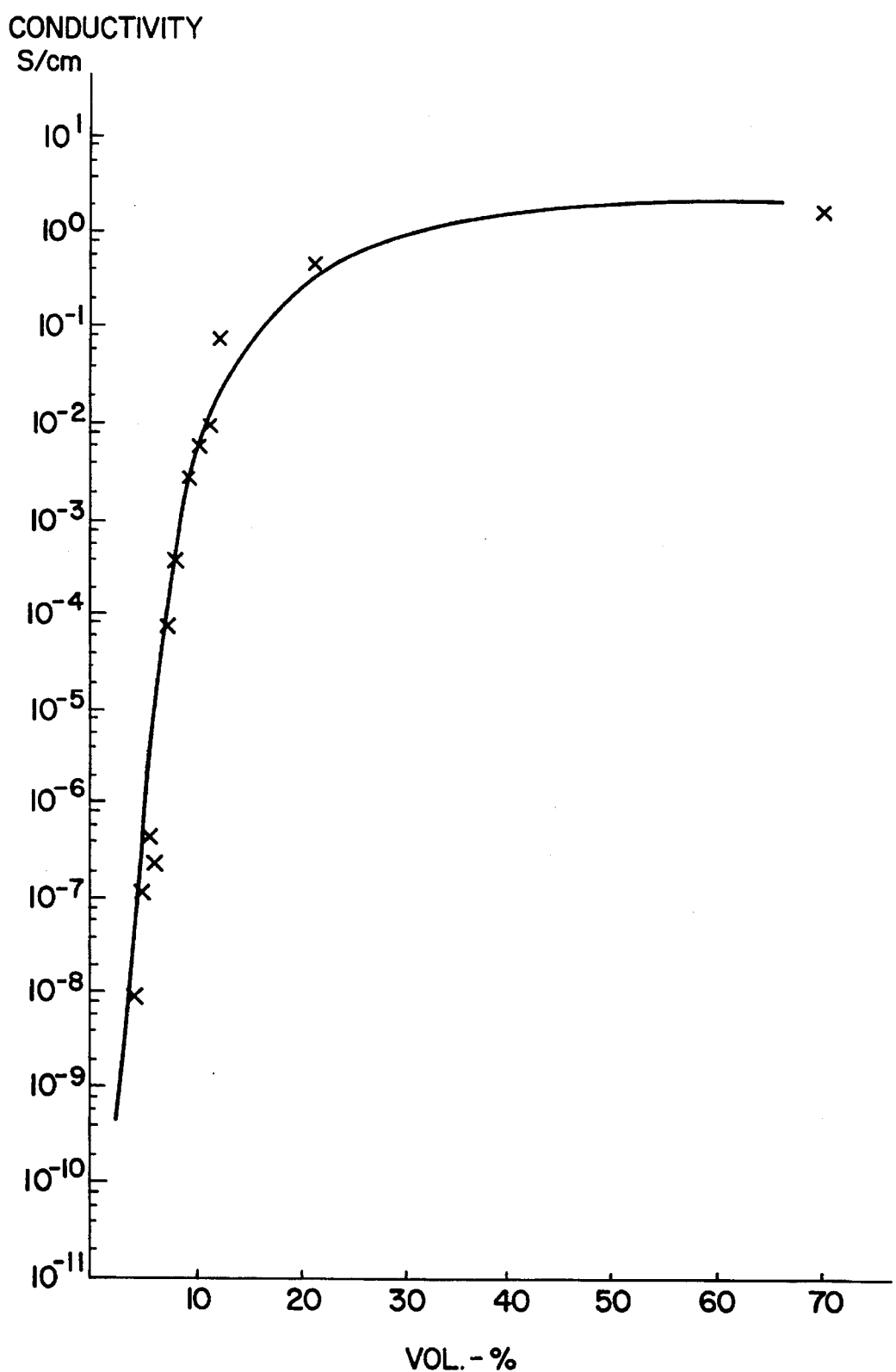
FIG. 1 illustrates the relationship of the log of the conductivity versus the volume concentration after dispersion in PCL.

The subject of the invention is an intrinsically conductive polymer that exists in the form of a dispersed solid made up of primary particles with a specific surface area according to BET of >15 $m^2/g$ and with an average diameter of less than 500 nm. Preferably, the polymer contains in the particle size range >500 nm not more than 20% aggregates with an average size of >0.5 μm.

In general the polymer contains more than 80% of dispersible primary particles with an average diameter of less than 500 nm, as shown in the appropriate tests.

The new teaching of the invention is in the fact that unformed ("raw") intrinsically conductive polymers are particularly well processable or shapable, when they consist of primary particles which are not connected with each other by material bridges (i.e. they are not assembled into aggregates) but exist as individual particles or as re-dispersible agglomerates.

It was particularly surprising to establish that an intrinsically conductive polymer of a certain chemical structure with the same morphological structure of the primary particles and secondary structures has proved suitable for the two different further processing procedures (processing of the pure raw substance or dispersion to polymer blends) in spite of their completely different requirements.

The ICP raw materials are particularly well suited for further shaping processing a) in pure form using the high pressure process described in DE-PS 34 21 993, but particularly in a further embodiment described below (isostatic pressure), what is particularly surprising here is that this form of the raw materials seems to flow better;

b) as a dispersion in polymer blends according to DE-PS 34 22 316. Here two aspects are particularly surprising:

the limitations to manufacturing polymer blends described in the German Patent Specification can largely be eliminated, with an improved dispersion a lower percolation point (lower critical concentration) and a lower point (lower concentration) of saturation conductivity are achieved which contradicts the previously accepted percolation theory.

The preparation of agglomerates which are dispersible into individual primary particles instead of structured aggregates was previously regarded as impossible and also held to be disadvantageous. Among experts the dispersions first described in DE-PS 34 22 316 were therefore regarded as a step in the wrong direction, and the success of the percolation attributed not to the dispersion but directly to the non-dispersed structured aggregates (cf. inter alia: "Elektrisch leitfähige Kunststoffe" by S. Roth, H. J. Mair (Ed.), Carl Hanser Verlag Munich/Vienna, 1986). Flow processes in pure ICPs particularly with non-aggregated primary particles are in general considered impossible. The success of the invention is also very surprising in this respect.

It is important that the intrinsically conductive polymer exists as a dispersible solid with a purity of more than 90%, i.e. it does not contain more than 10% by weight of impurities originating from the polymerisation, particularly polymerisation aids. In other words this means that the dry mass of each of the respective polymers corresponds to at least 90% of the elementary analysis of the intrinsically conductive polymer, i.e. it is preferred to produce the purest ICPs possible in the claimed morphology containing only such residues of polymerisation reagents, by-products and auxiliary agents as cannot be eliminated at an economically viable cost.

The shape of the primary particles is not important. Many of the ICPs according to the invention admittedly occur as spherical or near-spherical primary particles, but other shapes (rods, fibrils, angular shapes or asymmetric structures etc.) are suitable as long as the specific surface area, the particle size and the purity meet the given specifications.

All conductive polymers are suitable and their (reversibly) "doped" (in other words: complexed, oxidised or protonised or charged) conductive forms are preferred. The polymers preferably contain counter ions with a molecular weight of not more than 1000, such as e.g. benzolsulphonate. ICPs are further preferred which are insoluble in organic solvents or only in very few solvents e.g. in those with a solubility parameter of 11 $(cal/cm^3)^{1/2}$. Suitable polymers are, e.g. polydiacetylene, polyacetylene (PAc), polypyrrole (PPy), polyaniline (PAni), polythiophene (PTh), polyisothianaphthene (PITN), polyheteroarylenvinylene (PArV), in which the heteroarylene group can be, e.g. thiophene or pyrrole, poly-p-phenylene (PpP), polyphenylensulphide (PPS), polyperinaphthaline (PPN), polyphthalocyanine (PPhc) and other conjugated polymers, their derivatives (i.e. polymers of derivatives e.g. substituted with side-chains on the ring or on the heteroatom [these derivatives being] of the monomers forming the above mentioned polymers) and their copolymers and their physical mixtures with each other.

In general all polymers are suitable that are convertible via a reversible oxidation or reduction and/or via reversible protonisation or other deriving reactions (which one can to some extent describe as a complexing or compensation reaction) into conjugated, positive or negative polymer chains (the charging of which is compensated by ions of the opposite charge), by which means the polymer can exist in states of different conductivity (which normally have a different chemical composition). Polymers are preferred with a conductivity which can reach more than $10^{-2}$ S/cm.

The intrinsically conductive polymers can depending on the application be obtained in neutral, reduced or oxidised form or in protonised/deprotonised form, then processed in the further procedures and used.

The ICP raw materials according to the invention have surprisingly proved to be more suitable than the raw materials used in these processes previously both for further processing as a pure substance in high pressure processes according to DE-PS 34 21 993 and for dispersion in polymer blends according to DE-PS 34 22 316. Additional advantages that were not foreseeable have also emerged, such as

- simplification of the processing conditions of the high pressure processing of pure polymers
- particular suitability for high pressure processing under isostatic conditions,
- improved homogeneity of the finished products,
- possibility of use for polymer blends with less restrictions than in DE-PS 34 22 316,
- a lower concentration of ICP to achieve percolation (percolation threshold <7.5 Vol. %) and a lower concentration of ICP to achieve the saturation conductivity,
- obtaining a reversible reactivity of the conductivity, optical, electronic and other properties of the ICP despite decisive changes in the morphology.

Particular emphasis should be placed on those advantages that facilitate new applications, advantages such as the improved homogeneity and electrical and mechanical properties of pure ICP mouldings, improved transparency in polymer blends with low ICP concentration, a lower and more reproducible percolation point and a lower saturation conductivity concentration in polymer blends with a higher concentration of ICPs.

It is not yet possible to provide an explanation for the success of the invention. It is not clear why ICP raw materials which are assembled into secondary structures (such as fibrils or other aggregates) are less suitable for high pressure forming even though they are in fact already partly pre-formed. It is also unclear why, for example, it is almost not possible to disperse secondary fibrils in which sphere-like structures can be seen as the primary particles in polymer blends, while the raw materials according to the invention are even more dispersible than the raw materials used in DE-PS 34 21 993 and DE-PS 34 22 316.

The ICP raw materials according to the invention can be manufactured in various ways, e.g. electrochemically or chemically. Chemical processes in which the "doped" (in other words: charged, oxidised, protonised) conductive polymer is formed directly and is not obtained in its uncharged forms and in which the formation of many centres of reaction is possible, have proved particularly suitable; a method in which the length of time that the reaction is being carried out is itself relatively long or the rate of reaction is reduced also appears advantageous. In any case it is preferable to polymerise in media in which the monomer and the doping (complexing) agent are soluble, or are present in colloidal dispersion, but in which the polymer is insoluble. It has emerged that it is additionally preferable that the polymers are synthesised in the purest possible chemically unitary form and cleaned intensively during reprocessing.

Further the invention is directed to a process for the preparation of intrinsically conductive polymers in the form of dispersible solids with the specific surface area and the particle size range given above, in which process the polymerisation is carried out in a solvent in which the appropriate monomer is soluble or exists in a colloidal dispersion, but in which the polymer formed is insoluble, and in which process the temperature of the reaction mixture is controlled by cooling so that it will not rise to a value more than 5° C. over the starting temperature. This starting temperature is room temperature or below, i.e. normally will not exceed 20° C. Preferably the temperature is not allowed to rise to a value more than 2° C. above the starting temperature.

The polymerization is preferably carried out under an inert gas atmosphere, in particular under a nitrogen blanket. It is further preferred to control the reaction by keeping the electrochemical potential of the reaction mixture <730 mV.

The viscosity of monomer solution or dispersion before the start of the polymerisation reaction is advantageously >0.9 mPa.sec. The viscosity of the monomer solution or dispersion is preferably adjusted by the addition of an organic substance which is soluble in the reaction medium and which increases the viscosity. These substances are not necessarily surface-active. They can have a macromolecular structure. The only restriction on the selection of these substances is that they should be able to be washed out easily in the reprocessing of the already polymerised ICP. Siloxane copolymers have, for example, proved useful for the synthesis of polyaniline.

If the polymerisation is carried out at a temperature of $\leq 20°$ C. or 1° to 2° C. above the temperature at which the dissolved monomer precipitates, the viscosity of the reaction medium will increase and the rate of reaction will decrease.

While previously polymerisations of ICP effected chemically (usually suspension polymerisations) were predominantly storted and carried out at ambient temperature or above withot temperature control, apart from in the polymerisation of PAc (which is polymerised at temperatures of −30° to −70° C.), processes for the production of the intrinsically conductive polymer raw materials according to the invention have proved effective which have taken place at or below 20° C., preferably below 18° C. In these it is important to avoid any precipitation (crystallising out) of one of the reaction components. The temperature of the suspension is kept at such a level that the reaction only just takes place.

It is possible to both add materials which increase viscosity and to work at a lower temperature. Because of the frequent formation of the heat of reaction good cooling should be provided. This is achieved by the installation of heat-exchange surfaces in the reactor. This should additionally be taken into consideration when the concentration is determined at which the operation will be carried out. The lower this is set the higher the heat capacity, thus avoiding local temperature peaks. The process is usually carried out with less than 20% by weight, and preferably less than 10% by weight, of monomer in the solution or dispersion.

The order of addition of the reagents also appears to have a certain influence on the quality of the raw materials according to the invention. The addition of the polymerisation reagent (oxidation agent) to the suspension or dispersion/solution of the monomer is preferably such that the heat effect of the reaction can be dissipated. As a rule this demands that the addition lasts more than 30 minutes with reaction mixtures with 100 g of monomer. It is also advantageous to pre-mix the monomer solution or dispersion and the reagents at a temperature below that at which the polymerisation begins, and to slowly heat [the mixture] to the starting temperature after which the heat effect must be largely dissipated.

The monomer is preferably added in doses according to the progress of the polymerisation. The polymerisation is generally carried out under strong mechanical agitation. If the monomer is not soluble in the dilution agent used, the usual emulsifiers and/or aids to dispersion are added to obtain a suitable monomer dispersion.

It has also emerged that it is preferable to maintain a certain oxidation potential when carrying out the polymerisation. This is generally the lowest potential at which the reaction still takes place. Because this however requires very long reaction periods it is better to select a higher potential, a limit being placed on its value by the condition that one must avoid over-oxidation. The suitable polymers were therefore usually polymerised at between 550 and 800 mV, and preferably at 600–700 mV vs Ag/AgCl.

The reaction and shaping should also be implemented following the instructions in-EP-OS 168 620 and 168 621 for the manufacture of purer and more homogeneous ICPs. In addition it is known to be advantageous during the forming to treat the ICP intermediate product with compensation and complexing (i.e. de-charging and then re-charging). At the compensation stage, if necessary, an over-oxidation can be corrected by the addition of a reduction agent (e.g. $N_2H_4$). For polymerisation in an aqueous medium it has proved advantageous to add organic water-miscible solvents during the forming stages and thus to greatly reduce the water content of the intermediate products. This results in more easily dryable and less aggregated ICP raw materials according to the invention. Suitable here are ethanol and other water soluble alcohols, ketones such as acetone, THF, DMSO etc. The freshly polymerised and washed ICP can thus first be compensated in water (discharged) and filtered, and then taken up with organic solvents, if necessary dispersed according to EP-OS 168 620 and then washed again and filtered, after which the further forming stages take place (with or without subsequent complexing/charging) for the preparation of the ICP.

In many cases it has additionally proved effective to add small amounts (0.1 to 5% by weight) of surface-active substances during the synthesis and/or during processing. In some cases it has also proved advantageous to heat the polymer suspension or dispersion to a temperature of around 100° C. after the end of the polymerisation reaction during the processing, this post-treatment stage being carried out with released hot steam or under increased pressure. In this cleaning stage the ICPs may be in an aqueous or organic medium. It was found that the tendency of the polymer particles to aggregate during further processing can be reduced by this treatment. The polymer powder is preferably reversibly converted by oxidation or reduction or by being treated with an acid or base into a conductive or non-conductive oxidation or protonisation state without the shape and size of the primary particles being significantly altered.

After the cleaning and processing stages, and if appropriate compensation or complexing, the raw material according to the invention is prepared, e.g. dried, for use in the subsequent processing procedures. As was described above, very well dried and de-gassed raw materials are preferably used for the processing of the pure ICP in the high pressure process. Only pre-dried raw materials according to the invention can be employed for use in polymer blends; the final drying can then take place during the manufacture of the polymer blend, especially as the majority of synthetics processing machines are equipped with de-gassing options.

The raw materials according to the invention can be characterised using the measurement of the specific surface area. In contrast to previously known powder-form ICP raw materials those according to the invention have a specific surface area (measured using the BET method) of more than 15 $m^2$/g, and preferably more than 25 $m^2$/g.

The raw materials according to the invention occur as powder with 80% by weight of the primary particles being smaller than 500 nm, and not more than 20% by weight of these being aggregated into aggregates of more than 1 um.

This can be seen from scanning electron microscope photographs of the dried solid and using the light microscope from the SEM (electron microscope) examinations of the dispersions in polymer blends.

The light microscope examination is carried out with the solid according to the invention dispersed in a test polymer either directly or as a concentrate with the help of an internal mixer. Suitable as test polymers are PCL or PVC. The concentration of the substance to be dispersed is usually 0.5% by weight. The mixture is pressed out to a thin film. Using the raw materials according to the invention one can see an evenly highly coloured semi-transparent substance; the colouring is due to the dispersed primary particles. In addition one can see in some circumstances undispersed particles of 0.5–1 μm and single coarse particles.

The raw materials according to the invention can be formed following the instructions in EP-OS 168 621. An improved embodiment of EP-OS 168 621 consists in allowing the necessary pressure to act isostatically on the ICP. It was found thereby that manufacturing formed parts from conductive polymers under pressure and under an inert atmosphere leads to particularly homogeneous formed parts. Preforms can initially be manufactured under conditions of procedure which are subject to no particular restriction. It has emerged however that the use of formed parts according to DE-PS 34 21 993 gives better results. The application of isostatic pressure is successful when known hot-isostatic presses are used in which both the pressure and the inert atmosphere are provided by noble gases such as helium or argon.

It was particularly surprising that using this process an originally amorphous polyaniline, which after forming according to the prior art only has a vague semi-crystalline nature, and an originally x-ray amorphous polypyrrole after the application of isostatic pressure have a distinct semi-crystalline form in the x-ray diffraction pattern.

For the implementation of this embodiment of the invention any apparatus is in principle suitable which can produce isostatic pressure under an inert atmosphere and using which one can simultaneously bring the material to be formed or the preformed blank to the desired temperature, this being above the ambient temperature and below the decomposition temperature of the substance concerned. Oils are also suitable as the pressure transfer medium, preferred however is apparatus in which inert gases, e.g. noble gases such as helium or argon, serve both to supply the inert atmosphere and as the pressure transfer medium. A particularly suitable embodiment of the process consists in a preformed blank which, for example, has been manufactured according to the instructions in DE-PS 34 21 993, being introduced under an inert atmosphere into a vacuum-tight or pressure-tight casing, known as a capsule and the capsule being sealed so that it is pressure and vacuum-tight, e.g. by welding or soldering. The capsule is preferably made of metal, e.g. Cu or steel sheet. The capsule with the preformed blank is transferred into a suitable plant, e.g. into a apparatus for carrying out the so-called hot-isostatic techniques or for carrying out hot and isostatic pressing, such as used in powder metallurgy for the production of high-quality mouldings ("Hot isostatic pressing"). In the apparatus the desired pressure is set, this pressure should be above 50 bar and preferably above 200 bar, and the desired temperature, which should be above 35° C. and must be below the decomposition temperature at the chosen conditions. The pressure is then maintained longer than 10 minutes, after which the temperature drops first and then the pressure is regulated down to normal pressure. Then the apparatus and the capsule can be opened. Very homogeneous mouldings result, which depending on the chosen conditions of the process and the raw materials are extraordinarily rigid and break-proof.

The raw materials according to the invention are particularly suitable for this improved embodiment because

- very homogeneous mouldings already result from untreated raw materials in powder form,
- preforms from raw materials in powder form can be refined in a subsequent treatment under the described isostatic conditions into formed parts of previously unattainable quality (homogeneity, mechanical and electrical properties),
- lower pressures can be used than were previously necessary.

Formed parts of almost any geometry and size desired can therefore be made now from ICPs. In particular the new high quality of the formed ICP according to the invention permits, e.g. mechanical after-treatment. Formed parts (semi-finished products or almost finished products) can therefore be manufactured from ICP raw materials according to the invention of the most varied chemical composition which are brought to their final form by further processing such as, for example, cutting, boring, milling, machining, ultrasonic processing, spark erosion etc. One can therefore obtain, e.g. very thin (<100 µm e.g. to 0.5 µm) plates, or other components in any form desired.

The (electro)chemical properties of these substances, which do not change during the forming and further processing operations, additionally allow the manufacture of formed parts of a complicated structure, because by (electro)chemical aftertreatment various layers (insulating, semi-conductive, conductive) or structures (e.g. conductor channels or paths) and boundary layers (e.g. p-n-bridges) can be produced in or on a formed part. The various oxidation and protonisation states, for example, of e.g. polyaniline, make it possible to adjust the electrical properties of a finished product according to the requirements of the desired application almost at will.

A further particularly advantageous possible application of the ICP raw materials according to the invention is in their dispersal in polymers that are not electrically conductive. Processes suitable per se are described in EP-OS 168620, EP-OS 168 621 and EP 181 587. The raw materials according to the invention, however, create considerable additional advantages compared with the prior art in the application of analogous dispersion processes:

- They can also be dispersed in thermoplastic polymers with a solubility parameter of less than 8.6 $(cal/cm^3)^{1/2}$,
- Non-thermoplastic polymers can also be used as matrix polymers (duroplastic resinous substances, lacquers, latexes, liquid-crystal polymers etc.),
- Prepolymers are suitable as they were previously, including those which do not produce thermoplastic substances,
- A further advantageous embodiment of the use of ICP in blends which is made possible by the new ICP raw materials according to the invention consists in preparing the compensated (discharged) ICP and incorporating it into a polymer matrix which contains or can form reactive groups, with which the charging of the ICP can be carried out; useful here are polymers containing or forming, e.g. sulphonic acid or other acid groups, by which the discharged ICP is re-charged (complexed) in the polymer matrix,
- In comparable matrix systems a considerably lower critical volume concentration results (a lower percolation point) at which the polymer blends convert from the insulating into the conductive state: while previously (cf. EP-OS 0168620, page 16, line 12; B. WeBling, H. Volk, Synthetic Metals 18 671–676 (1987), here: page 673; B. WeBling, "Electronic Properties of Conjugated Polymers" Page 407–412, Springer Verlag) percolation was observed at around 7.5 to 10% by volume for polymer blends manufactured via the melt, percolation with the raw materials according to the invention is clearly possible at under 7.5% by volume, e.g. at 5 to 6% by volume or even lower. At the same time the concentration of ICP necessary to achieve maximum (=saturation) conductivity drops from over 40% by volume to under 40%, e.g. to 25 to 35 % by volume.

The polymer blends have advantageous antistatic properties depending on the concentration of ICP, which distinguish them from known forming materials that contain carbon black because of their low content and the non-black optical effect. Moreover they have the same properties as self-supporting films of PAc, PPy or PAni, e.g. as regards the temperature dependency of the conductivity, the (electro)chemical reactivity of the interactions with electromagnetic waves of all types or the thermoelectric power, which cannot be-achieved by compounds filled with conductive carbon black.

The raw materials according to the invention are preferably used after the after-treatment stages have been carried out (forming or polymer blend manufacture) e.g. in the following areas (this list being only by way of example and not limiting):

- as electrical conductors (e.g. as push switches, electrodes etc.) or semi-conductors,
- as protection against static charges,
- for shielding against electromagnetic waves (EMT shielding),
- for the absorption of microwaves (for shielding or heating purposes),
- for the manufacture of capacitors or to replace electrolytes in electrolytic capacitors,
- for the manufacture of semi-conductor components such as diodes, transistors etc.,
- as photo-conductors or in photovoltaic energy conversion,
- in compositions with metals or metalloids or in compositions with various conductive polymers in the exploitation of the thermoelectric effect as a temperature probe (IR-absorption) or in thermovoltaic energy conversion,
- as sensors,
- as indicators, e.g. by electrochromism, microwave absorption, thermoelectric power etc.,
- in processes of electrolysis or electrosynthesis as electrocatalytic electrodes (e.g. in fuel cells),
- in photoelectric catalysis or synthesis, and photovoltaic effects,
- in protection against corrosion, e.g. in anodic corrosion protection,
- as electrodes in re-chargeable batteries,
- as UV- and light-stable pigments.

The following examples are intended to illustrate the invention without however limiting it . . .

EXAMPLE 1

180 g of methane sulphonic acid and 120 ml of aniline are dissolved in 1200 ml $H_2O$ and then cooled to 0° C. (control of temperature to avoid precipitation or crystallisation). A refrigerated solution of 240 g of peroxydisulphate (oxidation agent) in 1200 ml $H_2$ is slowly added drop by drop over about 2 hrs and 30 mins, so that the temperature does not rise above 5° C. The raw polymer precipitated is filtered and washed four times in a 1M aqueous solution of methanesulphonic acid and filtered each time.

Yield: 202 g. Conductivity (dried powder, pressed cold): approx 5 S/cm. Specific surface (BET): 26 $m^2/g$.

EXAMPLE 2

Various monomers and opposite charged ions (complexing agents or protonisation agents or "doping agents") can be used as in Example 1 and different oxidation agents can be employed for the polymerisation, e.g.:

| Monomer | Solvent/ Dispersing Agent | Doping Agent | Oxidation Agent | Reaction temperature |
|---|---|---|---|---|
| Aniline | $H_2O$ | HX. in which X = Halogen. e.g. HCl.HBr $RSO_3H$. | $H_2O_2$/catalytic quantity of Fe(II) | 5° |
|  |  | e.g. 4-toluene sulphonic acid |  | 15–17° |
|  |  | $CH_3SO_3H$ |  | 5° |
|  |  | benzene sulphonic acid |  | 12° |
| pyrrole | $H_2O$ | $C_{12}H_{26}RSO_3H$ | " | 10° |
| thiophene | nitropropane | as above | " | 0° |
| (3-Hexyl)-thiophene | nitromethane nitrobenzol | $FeCl_3$ |  | 0–5° |
| Dihydroiso-thianaphthene | " | $O_2.FeCl_3.RSO_3H$ | $O_2.KMnO_4.FeCl_3$ | 0–5° |

To maintain the desired oxidation potential an Ag/AgCl electrode is immersed in the reaction vessel, the measured quantity outlet [of this electrode] being linked to a dosing pump via a redox-potential control device. The redox-potential desired can be set on the control device. It has proved beneficial not to polymerise above 730 mV.

EXAMPLE 3

The raw, washed polyaniline from Example 1 or the raw polymers from Example 2 are suspended in water and ammonia solution is added until the suspension reacts strongly alkaline. Then the process is carried out as described in EP-OS 0168620 and the compensated (neutralised or discharged) raw polymer is obtained. This is washed with water and filtered after every washing operation until the water used for washing only reacts slightly alkaline. The last filter cake is taken up in dimethyl sulphoxide and dispersed, e.g. using ultrasonics. To eliminate the remaining aggregates [the dispersion] is filtered through a black-band filter and then double the quantity of isopropanol is added to the filtrate. After two days the precipitated compensated polymer is filtered off and washed several times with isopropanol.

Specific surface (BET): 26 $m^2/g$ (polyaniline from Example 1)

EXAMPLE 4

The other polymers obtained according to Example 2 are treated in an analogous manner.

EXAMPLE 5

The raw materials according to the invention obtained as in Examples 1 to 3 are dried and examined in a scanning electron microscope. Primary particles are found of <250 nm, these are very easily distinguishable from one other, some isolated and some in agglomerates. The smallest recognisable primary particles have a diameter of 10 to 20 nm. The proportion of larger aggregates is less than 20%.

EXAMPLE 6

The compensated, intrinsically conductive polymer obtained according to Example 3 is dispersed following the instructions of EP-OS 168 620 in polyethylene glycol (PEG) at a concentration of 40%. The PEG-PAni concentrate is dried and then diluted in polymethylmethacrylate (PMMA) or polycarbonate (PC) in an extruder in the concentration suitable for non-linear optical uses.

EXAMPLE 7

The intrinsically conductive polymers obtained according to the Examples 1 to 3 (in the latter complexing is again with $H^+X^-$) are washed after the last washing operation with acetone, methanol or iso-propanol to simplify the subsequent drying, and then dispersed in polycaprolactone (PCL), polyethylene oxide, ethylene acrylic acid copolymers or polyvinylpyrrolidone following the instructions in EP-OS 168 620 in a concentration of 50 to 75% by volume and intensively dried during or after the manufacture of the dispersion. The concentrates of the intrinsically conductive polymers are then diluted in the desired concentration in the polymers to be used for the further applications, these [polymers] may or may not be thermoplastic.

EXAMPLE 8

100 ml of 70% methane sulphonic acid, 60 ml aniline and 10 g of Polysurf CG6 (Atlas Chemie Co.) are dissolved in 800 ml of $H_2O$. Separately 100 g of ammonium peroxydisulphate are dissolved in 500 ml of $H_2O$. Both solutions are cooled to 0° C. and then quickly combined. The heat of reaction must be rapidly dissipated. After filtering off, the cleaning is carried out as in Example 1.

Yield: 95 g. Conductivity (dried powder, pressed cold): approx. 3 S/cm. Average particle size (SEM): approx. 0.2 μm.

EXAMPLE 9

500 ml ABIL B 9950 (a siloxane copolymer from Th. Goldschmidt AG), 200 ml of 28% hydrochloric acid and 120 ml of aniline are dissolved in 500 ml of $H_2O$ and cooled to $-5°$ C. At this temperature a solution of 180 g of peroxydisulphate in 400 ml of $H_2$ is added slowly drop by drop. After 20 hrs the precipitated polyaniline is filtered off and cleaned four times as in Example 1 with 1.5M hydrochloric acid.

Yield: 210 g. Conductivity (dried powder, pressed cold): approx. $5\times10^{-1}$ S/cm.

Specific surface (BET): 20 $m^2/g$; average particle size: approx. 0.1 μm.

EXAMPLE 10

The product of Example 1 or the re-complexed product of Example 3 is intensively dried to a residual solvent content of <0.5% and then combined in a ball mill or a high-speed mixer with Polysurf CG6 in the ratio 3:1 (ICP:CG6). This product is dispersed in the concentration desired in the polymers required for the further applications (cf. Example 7 and 11). The following table contains the measured values for the conductivity when different quantities are dispersed in PCL.

| Vol. % PAni | Conductivity (S/cm) |
|---|---|
| 2.5 | $9 \times 10^{-12}$ |
| 2.7 | $1 \times 10^{-11}$ |
| 3 | $8 \times 10^{-7}$ |
| 3.4 | $3 \times 10^{-6}$ |
| 3.7 | $2 \times 10^{-3}$ |
| 4 | $5 \times 10^{-3}$ |
| 4.5 | $6 \times 10^{-3}$ |
| 5 | $2 \times 10^{-2}$ |
| 6 | $4 \times 10^{-2}$ |
| 6.5 | $6 \times 10^{-2}$ |
| 7 | $7 \times 10^{-2}$ |
| 8 | $1 \times 10^{-1}$ |
| 9 | $1 \times 10^{-1}$ |
| 10 | $2 \times 10^{-1}$ |
| 11 | $4 \times 10^{-1}$ |
| 12 | $6 \times 10^{-1}$ |
| 16 | 1.7 |
| 25 | 2.9 |
| 34 | 4.4 |

Figure 4:
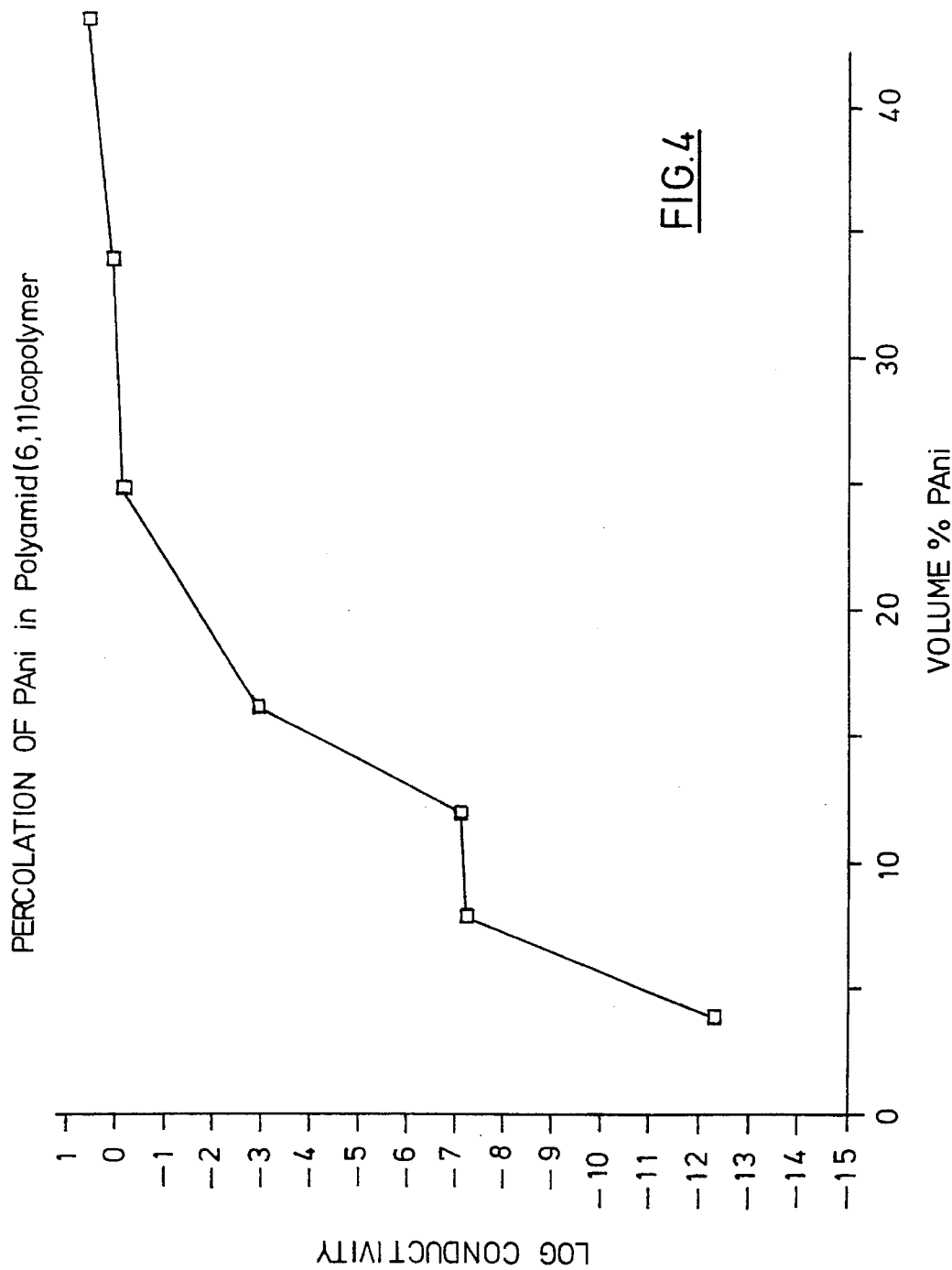
FIG. 4 illustrates the relationship of the log of the conductivity versus the volume percent of PAni.

In an analogous manner one can obtain polymer blends with polyester-polyurethane (Shore A 85)-PVC (K value 57)-blends (60:40) or polyamide-6,11 copolymers, which naturally have a different percolation behaviour because of their different matrix properties (see FIG. 4).

EXAMPLE 11

A polyaniline obtained as in the Examples 1 to 4 and treated as in Example 7 which can be processed to polymer blends shows the following dependency of the conductivity on the volume concentration after dispersion in PCL; Test 1 is shown in graph form in FIG. 1.

| Vol. % PAni | Conductivity (S/cm) | |
|---|---|---|
| | Test 1 | Test 2 |
| 3.7 | | $8 \times 10^{-9}$ |
| 4 | $9 \times 10^{-9}$ | $5 \times 10^{-7}$ |
| 4.5 | $1 \times 10^{-7}$ | $1 \times 10^{-7}$ |
| 5 | $4 \times 10^{-7}$ | $9 \times 10^{-6}$ |
| 6 | $3 \times 10^{-7}$ | $5 \times 10^{-6}$ |
| 6.5 | $2 \times 10^{-7}$ | $3 \times 10^{-6}$ |
| 7 | $8 \times 10^{-5}$ | $2 \times 10^{-6}$ |
| 8 | $4 \times 10^{-4}$ | $9 \times 10^{-4}$ |
| 9 | $3 \times 10^{-3}$ | $3 \times 10^{-3}$ |
| 10 | $6 \times 10^{-3}$ | $1 \times 10^{-2}$ |
| 11 | $9 \times 10^{-3}$ | $4 \times 10^{-2}$ |
| 12 | $8 \times 10^{-2}$ | $7 \times 10^{-2}$ |
| 16 | $1 \times 10^{-1}$ | $5 \times 10^{-1}$ |
| 25 | $2 \times 10^{-1}$ | $2 \times 10^{-1}$ |
| 34 | 1.5 | 2.0 |

Figure 2:
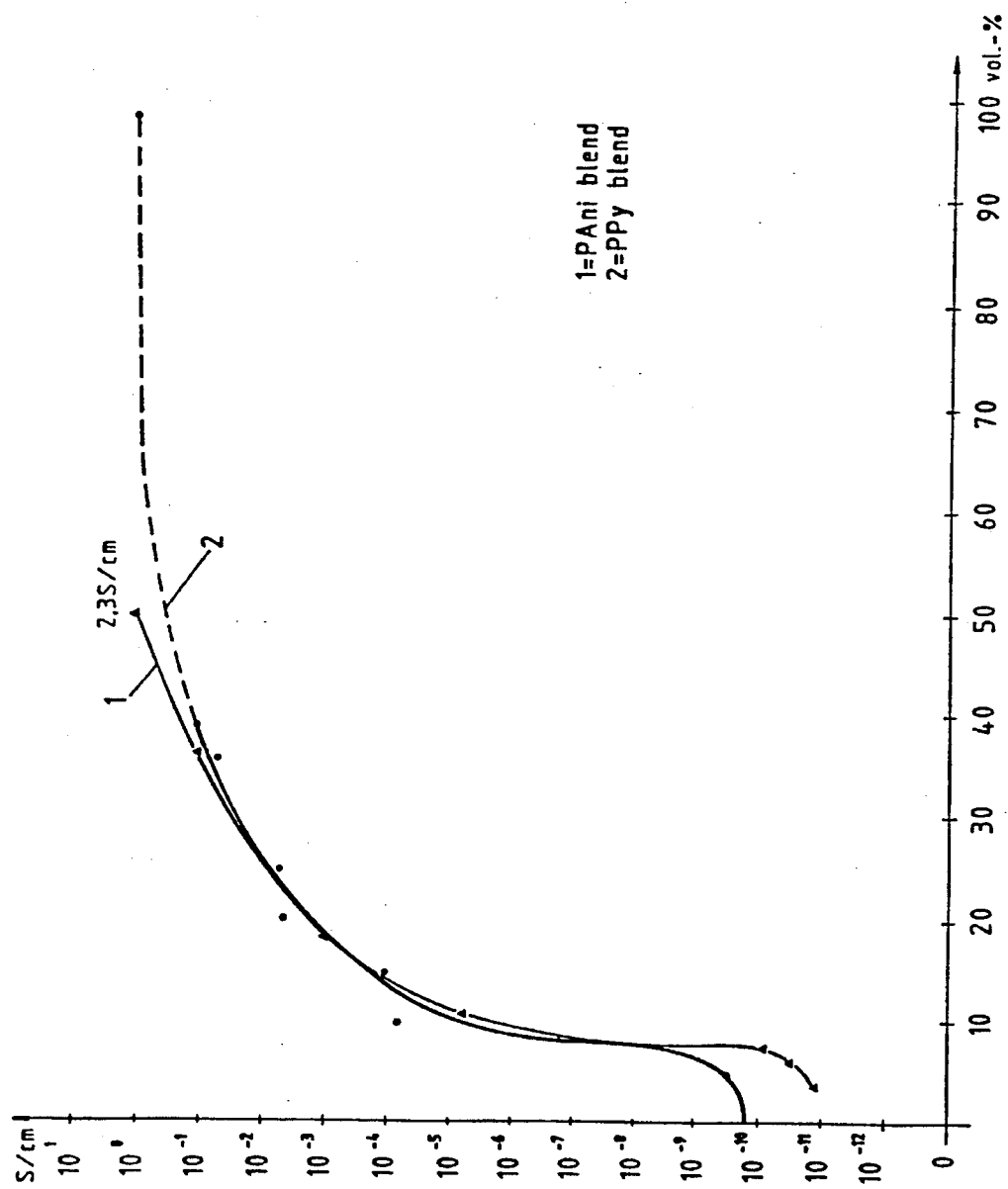
FIG. 2 illustrates the percolation curves of PAni and PPY.

Polyaniline and polypyrrole that do not correspond to the instructions in the invention exhibit a percolation curve as shown in the diagram of FIG. 2.

EXAMPLE 12

A concentrate of polyaniline hydrochloride in PCL produced as in the previous Examples is mixed with 7% conductive carbon black (Ketjenblack EC) and with 2% chlorinated polyethylene pre-stabilised with barium cadmium stearate in melt and extruded or pressed into electrode strips. The electrodes are placed in glass beakers which are connected via a salt bridge. Hydrogen peroxide in 1-N hydrochloric acid is added to one of the two glass beakers while hydrazine in 1-N ammoniac solution is added in the other beaker. A potential of 800 mV (without current) results and a maximum initial current of 2.1 mA.

EXAMPLE 13

Figure 3B:
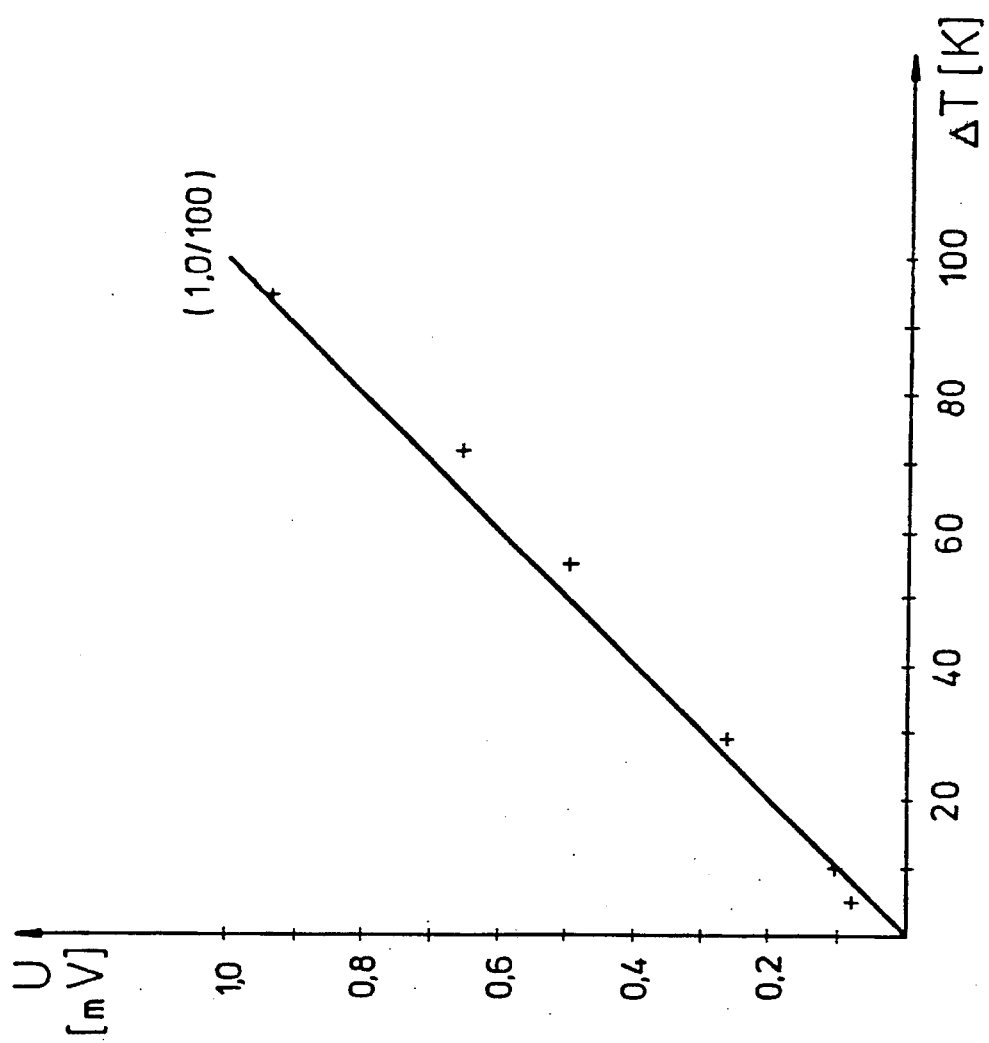
FIG. 3B illustrates the linear dependence of U[mV] versus T[K].
Figure 3A:
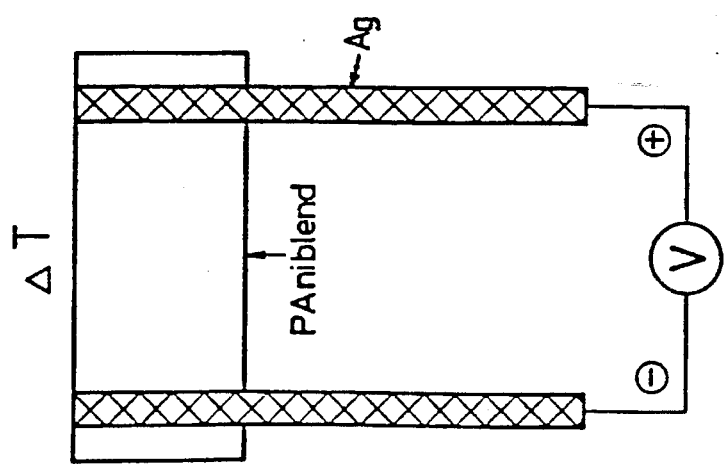
FIG. 3A illustrates an electrode.

A blend of polyaniline-$MeSO_3H$ in plasticised PVC obtained as in the previous Examples is pressed on to silver electrodes; one contact point is irradiated with infra-red [radiation] and the other is shaded as in the arrangement in FIG. 3A. There results a linear dependence of $U_{th}$[mV] vs T[K] and a thermoelectric voltage of 0.95 mV/100 K, cf. FIG. 3B.

EXAMPLE 14

The product from Example 10 is dispersed in a concentration of 1% in a polyurethane matrix. After leaving in normal climate (20° C., 55% relative air humidity) for 24 h the transparent film is antistatic ($10^8$ to $10^{10}\Omega$ surface and volume resistivity).

EXAMPLE 15

A product manufactured as in the Examples 1 to 4 is incapsulated under an inert atmosphere, and the capsule is placed in a hot-isostat press. The press is heated to 220° C. and the pressure is brought to 1100 bar. The pressure is maintained for 60 min, the capsule is cooled first and then the pressure is slowly released. A compact moulding can be taken from the case which is mechanically very strong, the conductivity and elementary analysis of which corresponds with that of the starting product.

EXAMPLE 16

Raw conductive polymer from one of the Examples 1–4 or 7–10 is dispersed in a ball mill into a solvent containing clear lacquer on a basis of chlorinated rubber or on a basis of a VC-copolymer. It is best to use a concentration of between 20 and 25% in relation to 100% of the lacquer containing the solvent.

Figure 5:
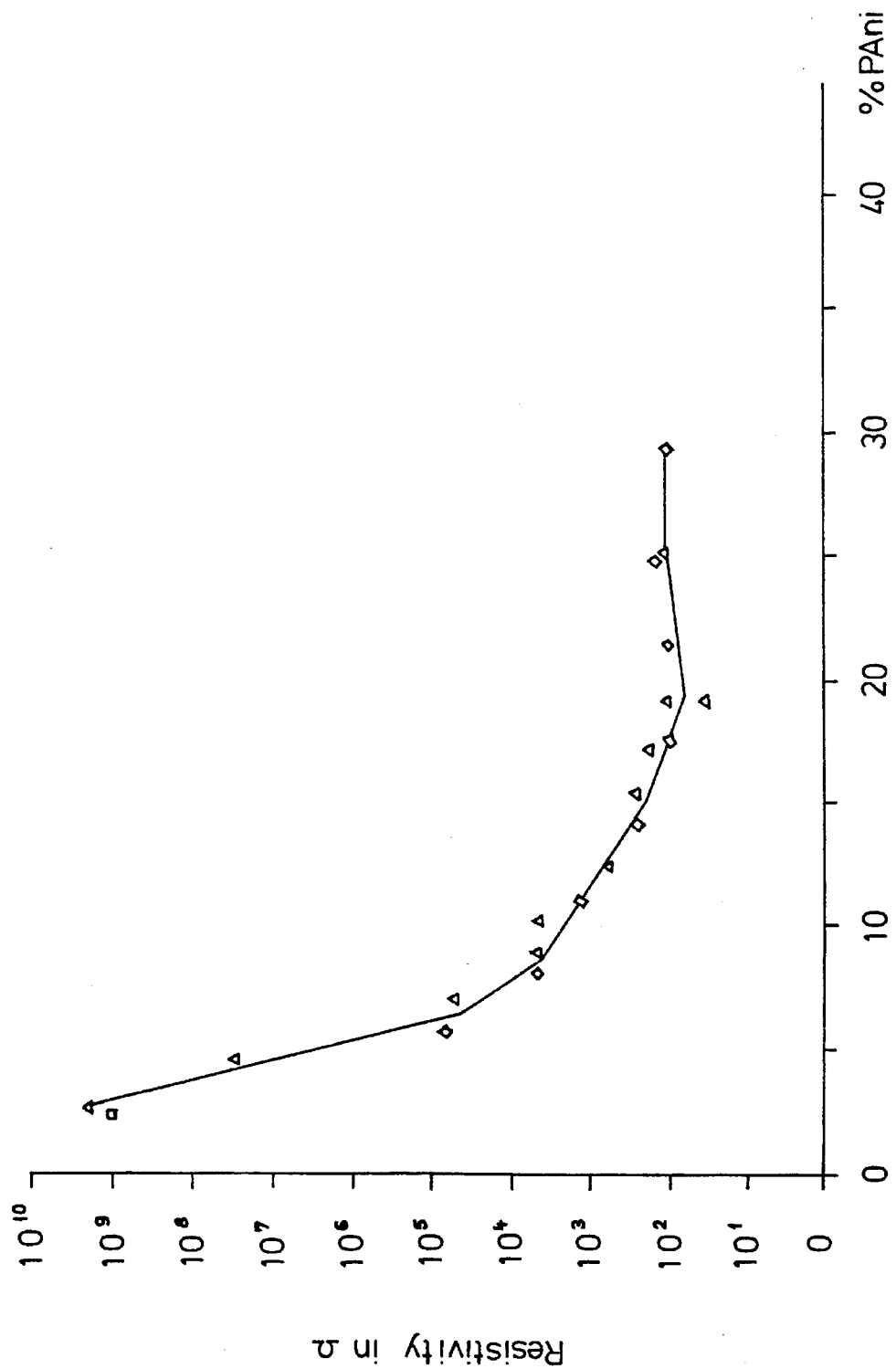
FIG. 5 illustrates the relationship of the resistivity in ohms versus the volume percent of PAni.

FIG. 5 shows the dependence of the conductivity of the dry lacquer on the concentration of PAni.

In its undiluted state the lacquer is only just brushable, it can however if required be diluted with MEK [methylethylketone] to obtain better flow properties.

The lacquer can be used depending on the concentration as an antistatic coating or for applications according to Example 17 or 18.

EXAMPLE 17

(Capacitor)

The conductive lacquer from Example 16 is applied to an aluminium foil which is either—as is usual in the manufacture of electrolytic capacitors—formed, or not formed. After a drying period of 12 to 24 hours the conductive lacquer coating is touched with conductive silver lacquer, so that it is possible to attach a connecting electrode. After a further drying period of approx. 30 minutes the measuring electrodes are attached to the aluminium foil and to the conductive silver coating. The following readings result (LCR bridge from Hewlitt-Packard):

|  | 1000 Hz | | | 100 Hz | | |
| --- | --- | --- | --- | --- | --- | --- |
|  | Capacity | Resistance | tan δ | Capacity | Resistance | tan δ |
| Capacitor from pure Al-foil, not formed | 11.73 | 15.22 | 0.76 | 30.95 | 37.36 | 0.99 |
| Capacitor from pure Al-foil, not formed, tempered 30 hrs at 90° C. | 3.78 | 169.14 | 0.15 | 4.99 | 513.98 | 0.27 |
| Capacitor from formed Al-foil | 5.66 | 120.75 | 0.25 | 8.80 | 384.36 | 0.50 |

One can see that probably an aluminium oxide layer is built up in the course of the tempering stage (3 h 80°) which corresponds to the forming process. The resulting capacitor is more efficient.

EXAMPLE 18

(Anodic Corrosion Protection)

The lacquer from Example 16 is applied to a non-corroded, smooth and polished steel plate. After drying the adhesion is relatively good. After a few days a section of the lacquer coating is scratched off with a spatula as a control and it is established that the iron has taken on a red-brown colour. The discolouration indicates that an iron oxide has been formed. The thin red-brown layer adheres firmly to the iron (on the steel plate) and does not have the porous, voluminous and poor adhesive character of normal rust.

To test the corrosion properties a number of steel plates were completely lacquered and tested in a salt-water corrosion test. The results are excellent in comparison to untreated steel and comparably good in comparison to conventional paints.

To examine the reaction which takes place between iron and PAni lacquer, carbonyl iron powder is coated with a PAni lacquer in an analogous manner as in Example 16 and dried in the rotatory evaporator. Following the completion of the reaction after a few days the lacquer is extracted with MEK. In the IR Spectrum in addition to a broad absorption, which may be due to an iron oxide, distinct bands can be seen that are characteristic of PAni which has been complexed with the respective acid. These bands do not disappear, at least not completely, after pyrolysis of the coated and extracted iron powder under a nitrogen atmosphere at 800° to 1000°. In the x-ray fluorescence analysis traces of sulphur can also be seen after this treatment, these are due to the complexing sulphonic acid. The iron powder is red-brown after this treatment and looks like an iron oxide powder.

An elementary analysis gave the following results: Fe 86.0%, C 7.4%, H 0.19%, 0 3.1%, N 1.19%, S 0.05%.

These results show that apparently a thermally stable complex with iron oxide is formed since some PAni is still present after the heat treatment.

EXAMPLE 19

(EMI shielding)

Thermoplastic polymer blends of conductive polymers, e.g. PAni(—$MeSO_3$ blends as in Example 10 or 11 ("A") are worked into plates of differing thickness and conductivity. As comparison materials electrode substances filled with carbon black ("B") are manufactured as in DE-PS 36 19 094 and the shielding of electromagnetic waves of different frequencies by all the plates is measured. The following values (in dB) result:

| shielding material | conductivity (S/cm) | thickness (mm) | shielding (dB) | | | at $10^6$ kHz |
| --- | --- | --- | --- | --- | --- | --- |
|  |  |  | 30 | 100 | 300 |  |
| A | 5 | 3.5 | 67 | 58 | 52 | 51 |
| B | 5 | 3.5 | 62 | 51 | 48 | 42 |
| A | 5 | 1.5 | 64 | 52 | 47 | 42 |
| B | 5 | 1.5 | 60 | 45 | 38 | 28 |
| A | 0.1 | 1.8 | 63 | 43 | 38 | 28 |
| B | 0.1 | 1.8 | 56 | 41 | 30 | 10 |

One can see that the polymer blends containing PAni are in every case superior to the comparison materials based on carbon black.

We claim:

1. Intrinsically conductive polyaniline powder in the form of a dispersible solid of primary particles having a specific surface area according to BET of >15 $m^2/g$ and an average (weight) diameter of less than 500 nm.

2. Polyaniline powder according to claim 1, wherein in its dried form it has a purity of at least 90%.

3. Polyaniline powder according to claim 1, wherein the conductive polymer is in a form that is reversibly doped by oxidation or protonisation.

4. Polyaniline powder according to claim 1, wherein the polyaniline powder contains no counter ions having a molecular weight of more than 1000.

5. Process for the preparation of the intrinsically conductive polyaniline powder in the form of a dispersible solid of primary particles having a specific surface area according to BET of >15 m$^2$/g and an average (weight) diameter of less than 500 nm, the process comprising the steps of:

polymerizing an aniline monomer in a solvent, in which the monomer is present in solution and the polyaniline powder formed is insoluble in the solvent, and the temperature of the reaction mixture is controlled by cooling so that it will not rise to a value more than 5° C. over the starting temperature.

6. Process according to claim 5, wherein the temperature is not allowed to rise to a value more than 2° C. above the starting temperature.

7. Process according to claim 5 wherein the polymerisation is carried out at a temperature $\leq$5° C.

8. Process according to claim 5 wherein the polymerisation is carried out such that the monomer concentration in the solution does not exceed 20% by weight at any time.

9. Process according to claim 5, wherein polymerisation is carried out under an inert gas atmosphere.

10. Process according to claim 5, wherein the electrochemical potential of the reaction mixture is kept at <730 mV.

11. Process according to claim 7, wherein the viscosity of the monomer solution is >0.9 mPa sec before the start of the polymerisation reaction.

12. Process according to claim 9, wherein the viscosity of the monomer solution is adjusted by the addition of an organic substance which is soluble in the reaction medium and increases the viscosity.

13. Process according to claim 11, wherein the viscosity of the reaction medium is controlled by adjusting the temperature to a sufficiently low value.

14. Process according to claim 5, wherein after the end of the polymerisation reaction the polymer suspension or dispersion is heated to a temperature above 100° C., this after-treatment being carried out in a closed container under increased pressure if necessary.

15. Process according to claim 5, wherein the polyaniline powder is converted reversibly by oxidation or reduction or by treatment with an acid or base into a conductive or non-conductive oxidation or protonisation state without significantly altering the surface area and size of the primary particles.

16. The polyaniline powder according to claim 1, wherein the average diameter of the primary particles is less than 250 nm.

17. The polyaniline powder according to claim 1, wherein the average diameter of the primary particles is between 100 and 200 nm.

18. The polyaniline powder according to claim 1, wherein the primary particles achieve percolation at less than 7.5% by volume.

19. The polyaniline powder according to claim 1, wherein the concentration of primary particles necessary to achieve maximum conductivity is less than 40% by volume.

* * * * *